(12) United States Patent
Van Der Werf et al.

(10) Patent No.: US 7,459,690 B2
(45) Date of Patent: Dec. 2, 2008

(54) LITHOGRAPHIC APPARATUS, DEVICE MANUFACTURING METHOD, AND DEVICE MANUFACTURED THEREBY

(75) Inventors: Jan Evert Van Der Werf, Waalre (NL); Mark Kroon, Utrecht (NL); Wilhelmus Cornelis Keur, Weert (NL); Vadim Yevgenyevich Banine, Helmond (NL); Hans Van Der Laan, Veldhoven (NL); Johannes Hubertus Josephina Moors, Helmond (NL); Erik Roelof Loopstra, Heeze (NL)

(73) Assignee: ASML Netherlands B.V., Veldhoven (NL)

( * ) Notice: Subject to any disclaimer, the term of this patent is extended or adjusted under 35 U.S.C. 154(b) by 99 days.

(21) Appl. No.: 11/432,365

(22) Filed: May 12, 2006

(65) Prior Publication Data

US 2006/0219931 A1 Oct. 5, 2006

Related U.S. Application Data

(60) Division of application No. 10/820,103, filed on Apr. 8, 2004, now Pat. No. 7,075,620, which is a continuation-in-part of application No. 09/934,681, filed on Aug. 23, 2001, now Pat. No. 6,721,389.

(30) Foreign Application Priority Data

Aug. 25, 2000 (EP) .................................. 00202960
Mar. 22, 2001 (EP) .................................. 01302647

(51) Int. Cl.
*G01J 1/42* (2006.01)
(52) U.S. Cl. .................................................. 250/372
(58) Field of Classification Search ............. 250/492.2, 250/372; 378/34, 35; 355/53, 54, 55
See application file for complete search history.

(56) References Cited

U.S. PATENT DOCUMENTS

| 3,745,358 | A | 7/1973 | Firtz et al. |
| 4,540,277 | A | 9/1985 | Mayer et al. |
| 4,695,732 | A | 9/1987 | Ward |
| 4,983,864 | A | 1/1991 | Murai et al. |
| 5,144,363 | A | 9/1992 | Wittekoek et al. |
| 5,222,112 | A | 6/1993 | Terasawa et al. |

(Continued)

FOREIGN PATENT DOCUMENTS

EP 0 987 601 A2 3/2000

(Continued)

OTHER PUBLICATIONS

J.H. Moore et al., "Building Scientific Apparatus," Addison-Wesley, Reading, Massachusetts, US XP-002177354, pp. 319-322 (1983).

(Continued)

*Primary Examiner*—Kiet T Nguyen
(74) *Attorney, Agent, or Firm*—Pillsbury Winthrop Shaw Pittman, LLP

(57) ABSTRACT

A radiation sensor for use with a lithographic apparatus is disclosed, the radiation sensor comprising a radiation-sensitive material which converts incident radiation of wavelength $\lambda_1$ into secondary radiation; and sensing means capable of detecting the secondary radiation emerging from said layer.

29 Claims, 4 Drawing Sheets

U.S. PATENT DOCUMENTS

| | | | |
|---|---|---|---|
| 5,349,194 A | 9/1994 | Wuest et al. | |
| 5,461,226 A | 10/1995 | Nicoli et al. | |
| 5,469,963 A | 11/1995 | Bonora et al. | |
| 5,567,949 A | 10/1996 | Okino | |
| 5,838,006 A | 11/1998 | Veneklasen et al. | |
| 5,847,468 A | 12/1998 | Nomura et al. | |
| 5,910,847 A | 6/1999 | Van der Werf et al. | |
| 6,297,876 B1 | 10/2001 | Bornebroek | |
| 6,406,820 B1 * | 6/2002 | Ota | 430/30 |
| 6,842,500 B1 * | 1/2005 | Komatsuda et al. | 378/34 |

FOREIGN PATENT DOCUMENTS

| | | |
|---|---|---|
| EP | 1 061 561 A1 | 12/2000 |
| JP | 52-024479 | 2/1977 |
| JP | 04-022852 A | 1/1992 |
| JP | 05 288696 | 2/1994 |
| JP | 09-135012 A | 5/1997 |
| JP | 2000-100685 A | 4/2000 |
| WO | WO99/45581 | 9/1999 |

OTHER PUBLICATIONS

European Search Report for Application No. EP 05010345, dated Jun. 20, 2005.

Notice of Reasons for Rejection for Japanese Patent Application No. 2005-250780 dated Jul. 31, 2008.

* cited by examiner

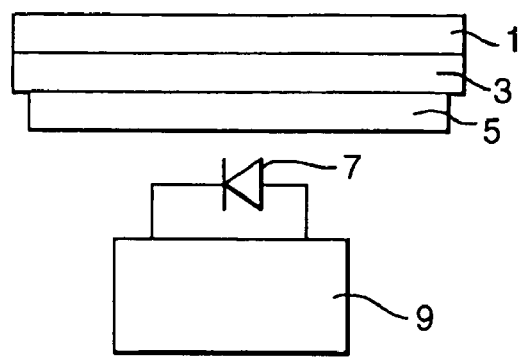
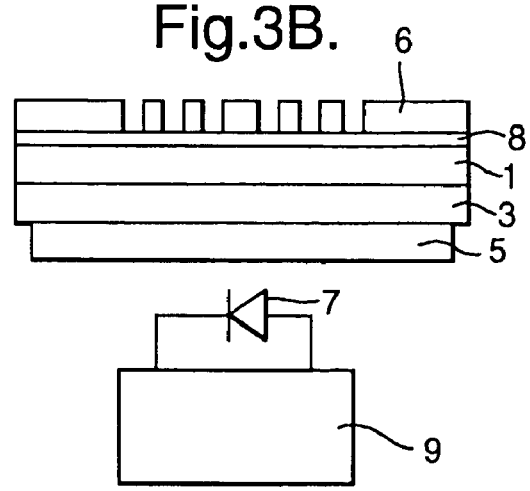
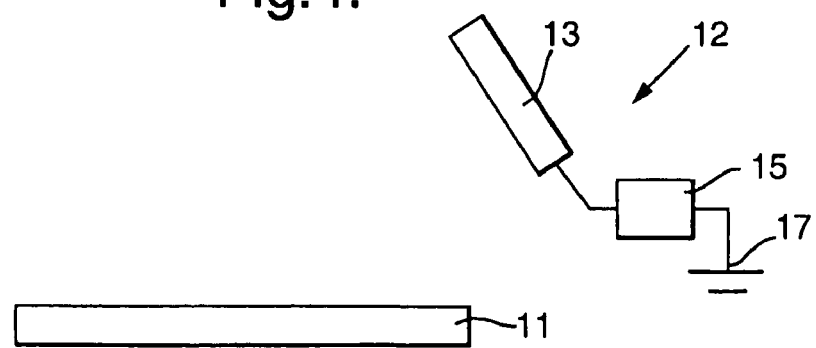

LITHOGRAPHIC APPARATUS, DEVICE MANUFACTURING METHOD, AND DEVICE MANUFACTURED THEREBY

This is a divisional application of co-pending U.S. patent application Ser. No. 10/820,103, filed Apr. 8, 2004, which is a continuation application of U.S. patent application Ser. No. 09/934,681, filed Aug. 23, 2001 (now issued as U.S. Pat. No. 6,721,389), which in turn claims priority from European Patent Application Nos. 00202960.1, filed Aug. 25, 2000, and 01302647.1, filed Mar. 22, 2001, the entire contents of each application hereby incorporated by reference.

FIELD

The present invention relates generally to lithographic projection apparatus and more specifically to lithographic projection apparatus including a radiation sensor.

DESCRIPTION OF THE RELATED ART

The term "patterning structure" as here employed should be broadly interpreted as referring to means that can be used to endow an incoming radiation beam with a patterned cross-section, corresponding to a pattern that is to be created in a target portion of the substrate; the term "light valve" can also be used in this context. Generally, the said pattern will correspond to a particular functional layer in a device being created in the target portion, such as an integrated circuit or other device (see below). Examples of such patterning structure include:

A mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired;

A programmable mirror array. An example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix-adressable surface. The required matrix addressing can be performed using suitable electronic means. More information on such mirror arrays can be gleaned, for example, from U.S. Pat. Nos. 5,296,891 and 5,523,193, which are incorporated herein by reference. In the case of a programmable mirror array, the said support structure may be embodied as a frame or table, for example, which may be fixed or movable as required; and A programmable LCD array. An example of such a construction is given in U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask and mask table; however, the general principles discussed in such instances should be seen in the broader context of the patterning structure as hereabove set forth.

Lithographic projection apparatus can be used, for example, in the manufacture of integrated circuits (ICs). In such a case, the patterning structure may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion at once; such an apparatus is commonly referred to as a wafer stepper. In an alternative apparatus— commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally <1), the speed V at which the substrate table is scanned will be a factor M times that at which the mask table is scanned. More information with regard to lithographic devices as here described can be gleaned, for example, from U.S. Pat. No. 6,046,792, incorporated herein by reference.

In a manufacturing process using a lithographic projection apparatus, a pattern (e.g. in a mask) is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

For the sake of simplicity, the projection system may hereinafter be referred to as the "lens"; however, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Twin stage lithographic apparatus are described, for example, in U.S. Pat. No. 5,969,441 and WO 98/40791, incorporated herein by reference.

In lithographic projection apparatus it is generally desirable to examine various aspects of the projection beam such as a dose (i.e. the total radiation energy per unit area delivered during an exposure), a focal plane position, uniformity of the beam, radiation distribution in a pupil plane of the projection system, etc. In addition, one may want to determine deviations of the projection beam introduced by the projection system, these deviations being referred to as aberrations. Examples of such aberrations are curvature of field, coma, astigmatism, spherical aberration, third and fifth order distortions, etc. In order to determine aforementioned beam aspects and aberrations, a radiation sensor for detecting radiation may be employed in the lithographic projection apparatus.

The present invention is concerned with radiation having wavelengths shorter than 50 nanometer (nm). An example of such radiation is extreme ultraviolet (EUV) with wavelengths typically in the range of 10 to 15 nm. A major problem encountered in lithographic apparatus using such radiation is the generally strong absorption of the said radiation by solid materials, liquids and gases, whereby the intensity of the projection beam can diminish completely. Consequently, a radiation sensor capable of detecting said radiation cannot partially or completely comprise such a strongly absorbing material in the radiation path. Another drawback is that existing radiation sensors for detecting radiation having wavelengths shorter than 50 nm, such as photomultiplier tubes, gas chambers, etc.—commonly used in synchrotrons—have dimensions that are far too large for use in a lithographic projection apparatus. Such existing sensors may further dissipate too much heat, possibly leading to undesirable temperature variations of the said sensor and/or of its surrounding environment (e.g. the substrate, an interferometry mirror block that is part of the substrate table, etc.).

SUMMARY

One aspect of an embodiment of the present invention provides a lithographic projection apparatus wherein a radiation sensor is conveniently positioned, said radiation sensor being capable of detecting radiation having a wavelength less than 50 nm.

According to an embodiment of the present invention there is provided a lithographic projection apparatus including a radiation system for providing a projection beam of radiation having a wavelength $\lambda_1$ smaller than 50 nm, a support structure for supporting patterning structure, the patterning structure serving to pattern the projection beam according to a desired pattern, a substrate table for holding a substrate, a projection system for projecting the patterned beam onto a target portion of the substrate and a radiation sensor which is located so as to be able to receive radiation out of the projection beam, said sensor including a radiation-sensitive material which converts incident radiation of wavelength $\lambda_1$ into secondary radiation, and sensing means capable of detecting said secondary radiation emerging from said layer.

Such a radiation sensor allows detection of radiation below 50 nm. Said secondary radiation can comprise electromagnetic radiation that is very well detectable, or freed electrons that can be very well measured directly or indirectly.

In an embodiment said radiation-sensitive material converts said radiation of wavelength $\lambda_1$ into electromagnetic radiation having a wavelength $\lambda_2$ that is larger than wavelength $\lambda_1$. Appropriate radiation-sensitive material may be selected from CaS:Ce, YAG:Ce and ZnS:Ag,Al, for example In another embodiment said radiation-sensitive material converts said radiation of wavelength $\lambda_1$ into electrons freed from said radiation-sensitive material. The freed electrons can be measured indirectly by measuring a compensation current to the radiation-sensitive material, or directly by collecting the freed electrons and measuring their induced electrical current. A collector may be used for both methods, which is connected to some source of electrical potential that charges the collector positive with respect to the radiation-sensitive material. In this embodiment, the radiation-sensitive material may be comprised in at least one of said patterning structure, a reflector provided in said projection system and a reflector in said radiation system to monitor said projection beam along its path towards the substrate or as a contamination monitor.

According to a further aspect of an embodiment of the invention there is provided a device manufacturing method including providing a substrate that is at least partially covered by a layer of radiation-sensitive material, providing a projection beam of radiation using a radiation system, said projection beam having a wavelength $\lambda_1$ smaller than 50 nm, using patterning structure to endow the projection beam with a pattern in its cross-section, projecting the patterned beam of radiation onto a target portion of the layer of radiation-sensitive material, using a radiation sensor to detect radiation out of the projection beam, said sensor including a radiation-sensitive layer which converts incident radiation of wavelength $\lambda_1$ into secondary radiation, and sensing means capable of detecting said secondary radiation emerging from said layer.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. having a wavelength of 365, 248, 193, 157 or 126 nm) and extreme ultraviolet (EUV) radiation (e.g. having a wavelength in the range 5-20 nm), as well as electrons.

BRIEF DESCRIPTION OF THE DRAWINGS

Embodiments of the invention will now be described, by way of example only, with reference to the accompanying schematic drawings, in which corresponding reference symbols indicate corresponding parts, and in which:

FIG. 3A schematically depicts a radiation sensor according to a first embodiment of the present invention;

FIG. 3B schematically depicts a variation of the embodiment of FIG. 3A;

FIG. 4 schematically depicts a radiation sensor according to a second embodiment according to the invention;

DETAILED DESCRIPTION

Embodiment 1

Figure 1:
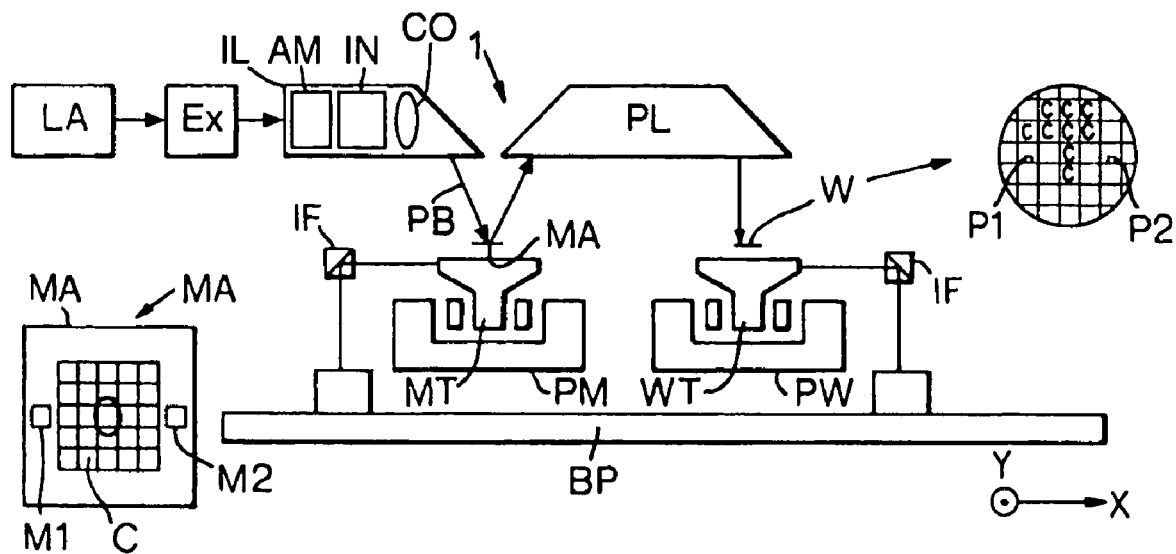
FIG. 1 schematically depicts a lithographic projection apparatus according to an embodiment of the invention.
Figure 2:
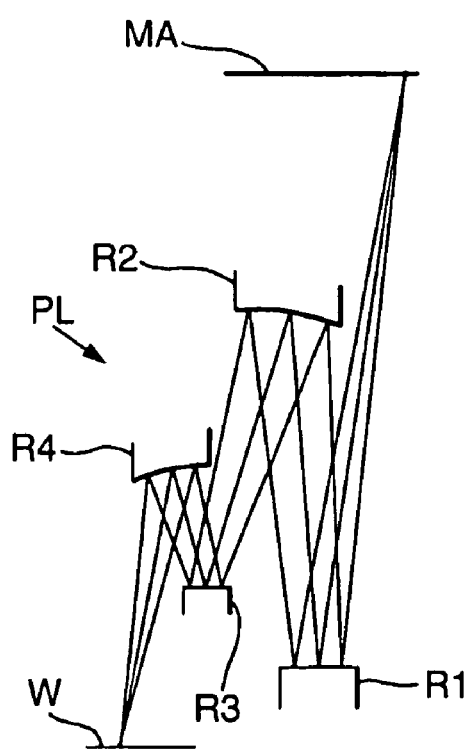
FIG. 2 schematically depicts a reflective-type projection system of the apparatus of FIG. 1.

FIG. 1 schematically depicts a lithographic projection apparatus according to a particular embodiment of the invention. The apparatus comprises:

A radiation system Ex, IL, for supplying a projection beam PB of radiation (e.g. EUV radiation). In this particular case, the radiation system also comprises a radiation source LA;

A first object table (mask table) MT provided with a mask holder for holding a mask MA (e.g. a reticle), and connected to first positioning means PM for accurately positioning the mask with respect to item PL;

A second object table (substrate table) WT provided with a substrate holder for holding a substrate W (e.g. a resist-coated silicon wafer), and connected to second positioning means PW for accurately positioning the substrate with respect to item PL;

A projection system ("lens") PL (e.g. a mirror group) for imaging an irradiated portion of the mask MA onto a target portion C (e.g. comprising one or more dies) of the substrate W. FIG. 2 shows a reflective-type projection system comprising four reflectors R1, R2, R3, R4, but may alternatively comprise another number of reflectors (e.g. six or eight reflectors).

As here depicted, the apparatus is of a reflective type (i.e. has a reflective mask). However, in general, it may also be of a transmissive type, for example (with a transmissive mask). Alternatively, the apparatus may employ another kind of patterning structure, such as a programmable mirror array of a type as referred to above.

The source LA (e.g. a laser-produced plasma or a discharge source) produces a beam of radiation. This beam is fed into an illumination system (illuminator) IL, either directly or after having traversed conditioning means, such as a beam expander Ex, for example. The illuminator IL may comprise adjusting means AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors); this latter scenario is often the case when the source LA is an excimer laser. The current invention and claims encompass both of these scenarios.

The beam PB subsequently intercepts the mask MA, which is held on a mask table MT. Having been selectively reflected by the mask MA, the beam PB passes through the lens PL, which focuses the beam PB onto a target portion C of the substrate W. With the aid of the second positioning means PW (and interferometric measuring means IF), the substrate table WT can be moved accurately, e.g. so as to position different target portions C in the path of the beam PB. Similarly, the first positioning means PM can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 1. However, in the case of a wafer stepper (as opposed to a step-and-scan apparatus) the mask table MT may just be connected to a short-stroke actuator, or may be fixed.

The depicted apparatus can be used in two different modes:

1. In step mode, the mask table MT is kept essentially stationary, and an entire mask image is projected at once (i.e. a single "flash") onto a target portion C. The substrate table WT is then shifted in the x and/or y directions so that a different target portion C can be irradiated by the beam PB; and 2. In scan mode, essentially the same scenario applies, except that a given target portion C is not exposed in a single "flash". Instead, the mask table MT is movable in a given direction (the so-called "scan direction", e.g. the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

In order to be able to determine, for example, the intensity or dose at substrate level, a radiation sensor can be located at a convenient position, e.g. in the vicinity of the substrate. An embodiment of such a radiation sensor is shown in FIG. 3A. This sensor comprises a radiation-sensitive layer 1 and sensing means. When EUV radiation of wavelength $\lambda_1$ is incident on radiation-sensitive layer 1, this radiation can either be converted into secondary electromagnetic radiation having wavelength $\lambda_2$ or into lattice vibrations of said layer.

To improve the ability to emit secondary radiation a rather complex material is employed, wherein said material generally comprises a host lattice (e.g. calcium sulfide (CaS), zinc sulfide (ZnS) or yttrium aluminum garnet (YAG)) and at least one ion such as $Ce^{3+}$, $Ag^+$, $Al^{3+}$, etc. Such ions are generally distributed in relatively small quantities in the host lattice. An example of a notation of such a material is CaS:Ce, whereby CaS is the host lattice, in which $Ce^{3+}$ ions are distributed. Materials suitable for use in said layer 1 can be selected from the group comprising: CaS:Ce, YAG:Ce and ZnS:Ag,Al. The thickness of such a layer is preferably smaller than 1 μm. Such layers are capable of converting EUV radiation into secondary radiation with wavelength $\lambda_2$ which differs from the wavelength of the incident beam; generally, $\lambda_2$ lies in the range of visible light or in the range of ultraviolet light. This secondary radiation emerges from said layer 1 in all directions.

Generally, layer 1 can be provided upon a layer 3—serving to bear layer 1—comprising a material (e.g. quartz or $CaF_2$) through which radiation with wavelength $\lambda_2$ is transmitted, whereby it is ensured that layer 1 is located so as to be able to receive EUV radiation out of the projection beam. At least part of said secondary radiation is subsequently collected by the sensing means that is sensitive to this radiation. An example of such sensing means comprises collection optics 5 and a silicon diode 7 connected to appropriate electronic circuitry 9. Collection optics 5 may comprise one or more lenses capable of directing emerging secondary radiation to said diode 7.

The radiation sensor may also be employed as (part of) an image sensor, with which it is possible to sense a pattern in the projection beam of EUV radiation in order to be able to, for example, align a reference position on the mask (generating a reference pattern) to the substrate table carrying the image sensor. Such alignment may be performed with nanometer accuracy. Furthermore, (a pattern in) the projection beam of EUV radiation may be sampled for analysis of different aspects such as a focal plane position of the projection system, uniformity of the beam, radiation distribution in the pupil plane of the projection system, etc. Those aspects can be determined using a transmission image sensor (TIS), for example. An example of such a TIS is described in U.S. Pat. No. 4,540,277, incorporated herein by reference. Also deviations of the projection beam introduced by the projection system can be determined with said radiation sensor, these deviations being referred to as aberrations. Examples of such aberrations are curvature of field, coma, astigmatism, spherical aberration, third and fifth order distortions, etc. More information on measuring of said aberrations can be gleaned from European Patent Application 01301571.4 and U.S. patent application Ser. No. 09/788,478 (P-0174), both incorporated herein by reference.

A schematic representation of such an image sensor is shown in FIG. 3B. It comprises a radiation sensor as described above with a metal layer 6 (e.g. a chrome layer) on top, in which a certain pattern (e.g. a grid-like set of lines) is etched. In order to protect radiation-sensitive layer 1, for instance, from the process steps involved to provide said metal layer with said pattern (e.g. by plasma etching), a protecting layer 8 is provided. This protecting layer 8 is located juxtapositionally with the said radiation-sensitive layer 1 on its radiation-receiving side, and its thickness is chosen so as to absorb only a small amount of incident radiation, ensuring enough transmission for accurate detection of EUV radiation. The thickness of such a layer 8 may lie in the order of 20 nm. Said protecting layer 8 may be selected from the group comprising, for example, diamond-like carbon (C), boron nitride (BN), silicon nitride ($Si_3N_4$), silicon carbide (SiC), B, Ru and Rh and compounds and alloys thereof. Subsequently, the patterned metal layer 6 is provided on the radiation-receiving side of, and juxtaposed with, said protecting layer 8.

Embodiment 2

In a second embodiment of the invention, which may be the same as the first embodiment save as described below, the radiation sensor converts the incident EUV radiation into secondary electrons being freed from the radiation sensor. The secondary electrons may be generated by different processes.

In a first process, radiation is incident on a radiation-sensitive layer with a certain energy. Part of this energy may be used to ionize an atom or ion in the radiation-sensitive layer. The remaining energy—the energy difference between the energy of the incident radiation and the ionization energy of the atom or ion (also referred to as the binding energy of an electron)—is converted at least partially into kinetic energy which enables the electron to leave the ion or atom, and said electrons may eventually leave the radiation-sensitive layer. These electrons are referred to as photo-electrons. In another process, electrons can be generated by the so-called Auger effect. A freed photo-electron may leave a vacancy at some low lying energy level. Subsequently, a second electron may relax from a higher energy state to this lower energy level within an atom or ion, and the relaxation energy can be transferred to a third electron, or Auger electron. If this relaxation energy is larger than the binding energy of the third electron, it will have a certain kinetic energy and will be able to leave the ion or atom and eventually may be able to leave the radiation-sensitive layer. Further electrons may be freed by the photo-electrons, Auger electrons and other processes induced by incident radiation, such as plasmon decay.

Electrons generated by the above processes emerge randomly out of the radiation-sensitive layer. Since an atom or ion comprises one or more electrons having different binding energies, electrons emerge from the said layer with a large range of kinetic energies.

The radiation sensor of the second embodiment, which is shown in FIG. 4 comprises a radiation-sensitive layer 11 and a sensor means 12. The radiation-sensitive layer 11 is able to convert incident EUV radiation into electrons via processes referred to above. Layer 11 may comprise a metal, for example.

Sensor means 12—located so as to be able to receive at least part of the generated electrons—comprises an electrical conductor 13, such as a conducting plate, and a current-measuring means 15 that is connected to ground (potential) 17. Once electrons—independent of their kinetic energy—are incident on conductor 13, an electrical current is induced, which can be measured by current-measuring device 15. This current is a measure of the number of incoming electrons which in turn is a measure of the intensity (energy dose) of the incident EUV radiation.

When electrons leave the radiation-sensitive layer 11, this layer 11 would become positively charged. Such a positively-charged layer then would attract the negatively-charged electrons that are freed. Electrons may eventually not be able to leave layer 11 and, consequently, may not reach the sensor means 12. Therefore, charging of the radiation-sensitive layer 11 must be electrically compensated, e.g. by connecting layer 11 to ground (potential) or by negatively biasing radiation-sensitive layer 11. Additionally, conductor 13 can be positively charged (or biased) so as to selectively attract and accelerate electrons freed from radiation-sensitive layer 11.

Figure 5:
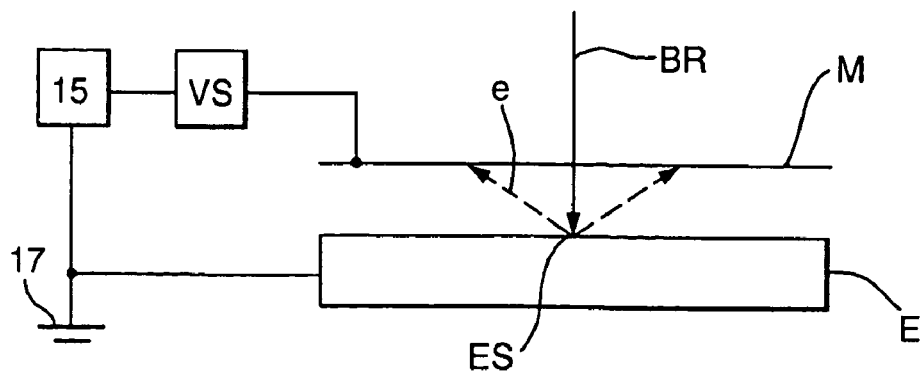
FIG. 5 schematically depicts a variation of the second embodiment.

With such a radiation sensor it is possible to determine, for example, the dose or intensity at substrate level when said sensor is located in the vicinity of the substrate. Determination of dose or intensity is not limited to substrate level, but can also be determined at other positions in the lithographic projection apparatus. The beam intensity incident on an element, such as a reflector R1, R2, R3, R4 of the projection system PL, a reflector in the illuminator, mask MA or substrate W (or any other surface on which radiation is incident) can also be determined. FIG. 5 shows a cross-section of such an element E on the surface ES of which a beam of radiation BR is incident. The beam of radiation BR causes electrons e to be liberated from the surface of the element E.

A mesh M is located above the surface ES of the element E. A voltage source VS is connected to mesh M and applies a predetermined positive voltage to the mesh. As a result the liberated electrons e are attracted to and collected by mesh M. To overcome space charge effects, a rather large positive voltage (with respect to the irradiated surface) applied to the mesh may be required. A negative voltage may be applied to the irradiated surface ES. Advantageously, the freed electrons experience an electric field strength in the order of 50 V/cm or even larger to overcome space charge effects due to freed electrons. For low incident beam intensities a lower field strength may suffice. Current measuring device 15 measures the electrical current due to electrons collected by the mesh.

Figure 6:
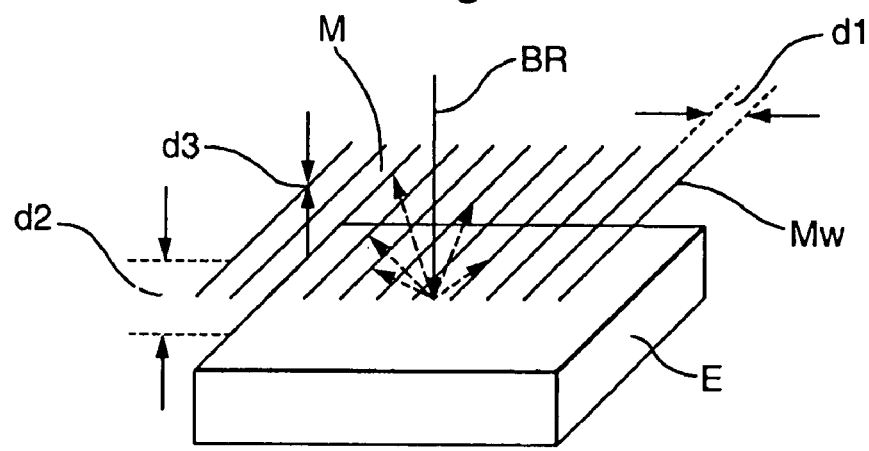
FIGS. 6, 7 and 8 schematically depict various implementations of the variation of the second embodiment.

FIG. 6 shows mesh M in perspective. In this case, the mesh is comprised of a plurality of parallel wires Mw. The thickness d3 of each of the wires is substantially smaller than the distance d1 between adjacent wires. This ensures that the mesh does not obscure the beam of radiation. Furthermore, the distance d1 between adjacent wires is smaller than the distance d2 of the wires from the surface ES of the element E. This ensures that the electrical field from the wires to the surface is approximately uniform.

A suitable size range for the wires Mw is a thickness d3 of 2 μm to 10 μm. The wires are typically formed from a conductor such as tungsten, molybdenum, copper or zirconium. A particular advantage of zirconium is that it is relatively transparent to EUV. The distance d1 between the wires and the distance d2 of the wires from the surface ES may both typically of the order of 1 cm.

Figure 7:
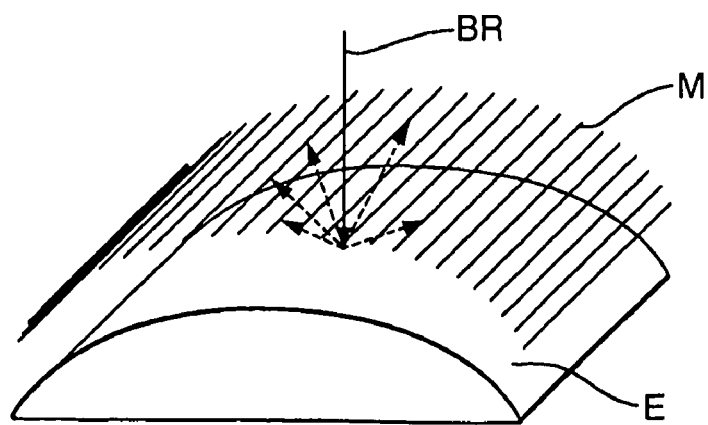
Figure 8:
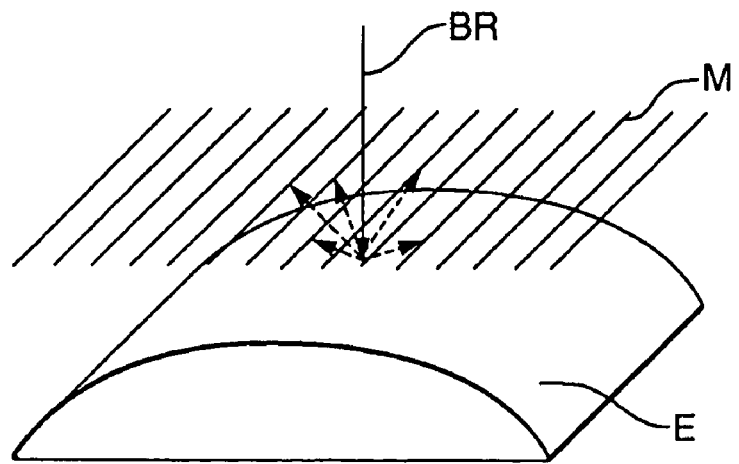

FIGS. 7 and 8 show the mesh of the present invention in use with a curved element E. In FIG. 7, mesh M is curved such that it approximately follows the curve of element E. In FIG. 8, mesh M is substantially planar. While in the above description the mesh has been described as being comprised of a plurality of parallel wires, it will be appreciated that a variety of patterns may be used advantageously.

Other types of conductors 13, M may also be used. Another option would be to employ a substantially annular-type of conductor that may circumscribe the incident beam so as to not obstruct it and that further may be substantially parallel to the irradiated surface. One such conductor is a ring-shaped conductor 13.

Further, by monitoring the photo-electric current as set out above using sensing means 15 one can also monitor the EUV projection beam throughout the system as progresses from the source towards the substrate. A measured change in photo-electric current at some element that does not correlate to measurements at other points in the system indicates some local change in the system. Such a local change may be contamination of a reflector (including the mask). Contamination present on the reflector will have its influence on the photo-electric current since it generally presents a different work function to electrons trying to escape from the reflector. The radiation according to the second embodiment may thus also be used as a contamination monitor.

Embodiment 3

Figure 9:
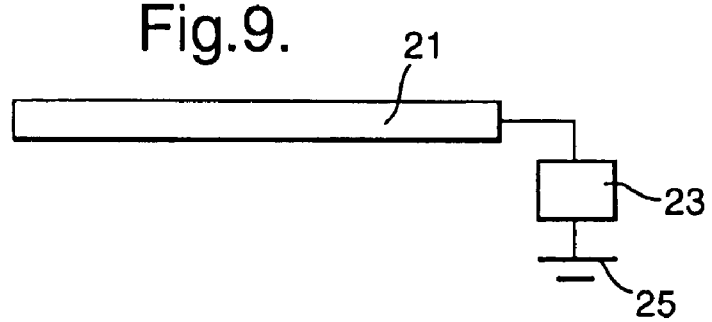
FIG. 9 schematically depicts a radiation sensor according to a third embodiment of the present invention.

In a third embodiment of the invention, which may be the same as the first or second embodiment save as described below, the radiation sensor also converts the incident EUV radiation into secondary electrons. A radiation sensor according to the third embodiment is depicted in FIG. 9 and comprises a radiation-sensitive layer 21, e.g. a metal, and a sensor means 23 which is connected to ground (potential) 25. Radiation-sensitive layer 21 is able to generate electrons according to similar processes as described for the second embodiment. The electrons thus generated and freed would create a positively charged layer 21 which, upon connection to ground 25, will be electrically compensated to yield a neutral layer 21. The resulting electrical current can be measured by sensor means 23, the current being a measure of the intensity of the incident EUV radiation.

The third embodiment also allows an intensity or dose to be measured by using an element such as a reflector in the projection system PL or illuminator IL, or the mask as a detecting element. In case of grazing incidence mirrors, response times will be relatively short since they generally will be made of a metal that will have a low electrical resistance. Normal incidence mirrors will generally comprise a multilayer stack that is tuned to the wavelength of the radiation to be reflected. The multilayer stack may comprise alternating layers of a metal and a semiconductor material, such as a stack of alternating molybdenum (Mo) and silicon (Si) layers. The overall resistivity of the mirror is generally large since it is determined by the specific contact resistance between the metal and the semiconductor. This resistance can be significantly reduced by doping the semiconductor layer. The smaller resistance will yield a better uniformity between incident intensity and measured current and faster response times.

As for the previous embodiment, also in this case the reflectors may be used as a projection beam or contamination monitor. Embodiments 2 and 3 may also be combined into a single embodiment. Further, embodiment 3 may be provided with a freed electron collecting conductor 13 to attract and collect freed photo-electrons as discussed for the second embodiment, but without measuring the electrical current of collected photo-electrons.

Embodiment 4

Figure 10:
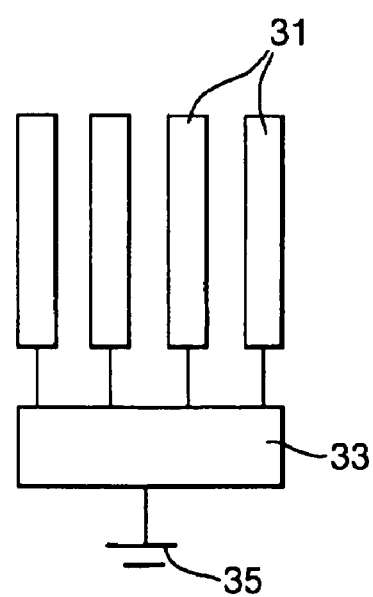
FIG. 10 schematically depicts a radiation sensor according to a fourth embodiment of the invention.

Another embodiment of the invention, which is depicted in FIG. 10 and which may be the same as the second embodiment save as described below, is a radiation sensor comprising an array of lines 31. Each line 31 comprises radiation-sensitive material for generating and release electrons, which would result in positively-charged lines. By connecting each line to ground (potential) 35, the current needed to compensate the charge in each individual line can be separately measured by sensor means 33. In this way, it is possible to discriminate between the dose of incoming radiation in each line, making it possible to determine, for instance, the uniformity of the projection beam.

In case the lines 31 are made of some semiconductor material, they may also be part of an electrical circuit measuring the electrical resistance of each individual line. Incident radiation will change the resistance of each line. The measured resistance will therefore be a measure for the amount of incident radiation.

The radiation sensor according to this embodiment may also be configured as an image sensor referred to in the second embodiment. Further, one may also provide a two-dimensional array of individual elements that are each connected to sensor means so as to measure their individual currents.

While specific embodiments of the invention have been described above, it will be appreciated that the invention may be practiced otherwise than as described. The description is not intended to limit the invention.

The invention claimed is:
1. A radiation sensor to detect radiation in a lithographic apparatus, comprising:
 a radiation-sensitive material configured to convert ultraviolet radiation having a wavelength smaller than 50 nm into secondary radiation, wherein the secondary radiation comprises visible light or ultraviolet light having a wavelength larger than or equal to 50 nm; and
 a detector constructed and arranged to detect the secondary radiation emerging from the radiation-sensitive material and constructed and arranged to determine intensity of the ultraviolet radiation having a wavelength smaller than 50 nm using intensity of the secondary radiation.

2. The sensor of claim 1, wherein the radiation sensor is for use with a subsystem of a lithographic apparatus, the subsystem including (i) a projection system, (ii) an alignment system, (iii) a transmission image sensor, or (iv) any combination of (i) to (iii).

3. The sensor of claim 1, wherein the radiation-sensitive material is configured to convert the ultraviolet radiation having a wavelength smaller than 50 nm from wavelength $\lambda_1$ into secondary radiation having a wavelength $\lambda_2$ that is larger than wavelength $\lambda_1$.

4. The sensor of claim 1, wherein the radiation-sensitive material comprises a compound selected from the group comprising: CaS:Ce, YAG:Ce, and ZnS:Ag,Al.

5. The sensor of claim 1, wherein the radiation-sensitive material is configured to convert the ultraviolet radiation having a wavelength smaller than 50 nm into electrons freed from the radiation-sensitive material.

6. The sensor of claim 5, wherein the detector further comprises a collector configured to collect the electrons freed from the radiation-sensitive material.

7. The sensor of claim 6, wherein the detector further comprises a measuring device, connected to the collector, configured and arranged to measure an electrical current induced by the collected electrons.

8. The sensor of claim 6, wherein the collector is configured to be positively charged with respect to the radiation-sensitive material so as to attract the freed electrons.

9. The sensor of claim 8, configured so that an electrical field strength between the radiation-sensitive material and the collector is such that the electric field overcomes space charge effects.

10. The sensor of claim 9, wherein the electrical field strength is larger than 50 V/cm.

11. The sensor of claim 5, wherein the detector comprises a measuring device electrically connected to the radiation-sensitive material so as to measure an electrical current induced by further electrons replacing the freed electrons.

12. The sensor of claim 11, wherein the radiation-sensitive material is arranged in an array of individual elements and the detector is arranged so as to separately detect electrons freed from the individual elements.

13. The sensor of claim 12, wherein the individual elements are arranged as an array of lines.

14. The sensor of claim 1, wherein the ultraviolet radiation having a wavelength smaller than 50 nm is extreme ultraviolet radiation.

15. A radiation sensor to detect radiation in a lithographic apparatus, comprising:
a collector configured to collect secondary radiation from a radiation-sensitive material that emits secondary radiation when exposed to ultraviolet radiation having a wavelength smaller than 50 nm, wherein the collector or radiation-sensitive material comprises a plurality of elements configured to receive incident radiation; and
a measuring device constructed and arranged to measure the secondary radiation emerging from the radiation-sensitive material to determine an intensity, and/or distribution thereof, of the ultraviolet radiation.

16. The sensor of claim 15, wherein the measuring device is electrically connected to the collector so as to measure an electrical current induced by the secondary radiation.

17. The sensor of claim 15, wherein the collector includes a mesh of a plurality of wires, or a conductor configured to surround a beam of the ultraviolet radiation, or both the mesh and the conductor.

18. The sensor of claim 15, wherein the radiation-sensitive material is configured to (i) emit secondary radiation having a wavelength that is larger than the wavelength of the ultraviolet radiation, or (ii) emit electrons freed from the radiation-sensitive material, or both (i) and (ii).

19. The sensor of claim 15, wherein the radiation-sensitive material comprises a compound selected from the group comprising: CaS:Ce, YAG:Ce, and ZnS:Ag,Al.

20. An image sensor configured to detect a patterned ultraviolet radiation in a lithographic apparatus, comprising:
a patterned layer of material configured to receive the patterned ultraviolet radiation, the ultraviolet radiation having a wavelength smaller than 50 nm;
a radiation-sensitive material configured to receive at least a portion of the ultraviolet radiation from the patterned layer and to emit secondary radiation in response thereto; and
a detector constructed and arranged to detect the secondary radiation emerging from the radiation-sensitive material and to determine an optical or spatial characteristic of the patterned ultraviolet radiation based upon the detected secondary radiation.

21. The sensor of claim 20, wherein the radiation-sensitive material is configured to emit secondary radiation having a wavelength that is larger than the wavelength of the ultraviolet radiation, emit electrons freed from the radiation-sensitive material, or both.

22. The sensor of claim 20, wherein the radiation-sensitive material comprises a compound selected from the group comprising: CaS:Ce, YAG:Ce, and ZnS:Ag,Al.

23. The sensor of claim 20, wherein the radiation-sensitive material is arranged in an array of individual elements and the detector is arranged so as to separately detect secondary radiation freed from the individual elements.

24. The sensor of claim 20, wherein the detector comprises a measuring device electrically connected to the radiation-sensitive material so as to measure an electrical current induced by further electrons replacing freed electrons.

25. The sensor of claim 20, wherein the detector comprises a measuring device, connected to a collector, configured and arranged to measure an electrical current induced by the secondary radiation.

26. A radiation sensor to detect radiation in a lithographic apparatus, comprising:
a plurality of individual elements of radiation-sensitive material configured to receive ultraviolet radiation having a wavelength smaller than 50 nm and to release an electric charge; and
a measuring device constructed and arranged to measure the electric charge released from the individual elements, an electric charge induced to compensate the electric charge released from the individual elements, or a change in the resistance of the individual elements, and constructed and arranged to determine intensity, and/or a distribution thereof, of the ultraviolet radiation using the measurement.

27. The sensor of claim 26, wherein the radiation-sensitive material is a semiconductor.

28. The sensor of claim 26, wherein the radiation sensor is an image sensor having an array of individual elements.

29. The sensor of claim 26, wherein the plurality of individual elements are part of a patterned layer of radiation-sensitive material.

* * * * *

UNITED STATES PATENT AND TRADEMARK OFFICE
CERTIFICATE OF CORRECTION

PATENT NO.         : 7,459,690 B2                                   Page 1 of 1
APPLICATION NO.  : 11/432365
DATED              : December 2, 2008
INVENTOR(S)        : Jan Evert Van Der Werf et al.

It is certified that error appears in the above-identified patent and that said Letters Patent is hereby corrected as shown below:

On the title page, item (60), Related U.S. Application Data, the text beginning with "continuation-in-part" should read --continuation--.

Signed and Sealed this

Eighteenth Day of August, 2009

David J. Kappos
*Director of the United States Patent and Trademark Office*